(12) United States Patent
Nakazawa

(10) Patent No.: US 9,711,668 B2
(45) Date of Patent: Jul. 18, 2017

(54) PHOTOVOLTAIC CELL

(71) Applicant: Guala Technology Co., Ltd., Kobe (JP)

(72) Inventor: Akira Nakazawa, Kobe (JP)

(73) Assignee: GUALA TECHNOLOGY CO., LTD., Kobe (JP)

( * ) Notice: Subject to any disclaimer, the term of this patent is extended or adjusted under 35 U.S.C. 154(b) by 349 days.

(21) Appl. No.: 13/854,165

(22) Filed: Apr. 1, 2013

(65) Prior Publication Data

US 2013/0276878 A1  Oct. 24, 2013

Related U.S. Application Data

(63) Continuation of application No. PCT/JP2010/067644, filed on Oct. 7, 2010.

(51) Int. Cl.
*H01L 31/00* (2006.01)
*H01L 31/042* (2014.01)
(Continued)

(52) U.S. Cl.
CPC ......... *H01L 31/0384* (2013.01); *H01G 9/204* (2013.01); *H01G 9/2027* (2013.01);
(Continued)

(58) Field of Classification Search
CPC ..... H01L 31/022425; H01L 31/022466; H01L 31/02366; H01L 31/0352; H01L 31/0384;
(Continued)

(56) References Cited

U.S. PATENT DOCUMENTS 4,888,062 A * 12/1989 Nakagawa et al. ........... 136/258
5,913,986 A    6/1999 Matsuyama
(Continued)

FOREIGN PATENT DOCUMENTS

JP  61-211965  9/1986
JP  62-194258  8/1987
(Continued)

OTHER PUBLICATIONS

English machine translation of JP 2001-167808A.*
(Continued)

*Primary Examiner* — Lindsey Bernier
(74) *Attorney, Agent, or Firm* — Oliff PLC

(57) ABSTRACT

A photovoltaic cell is provided that enables cost reduction and stable operation with a simple configuration and enhances conversion efficiency by a new technology of forming an energy level in a band gap. In the photovoltaic cell, a substrate, a conductive first electrode, an electromotive force layer, a p-type semiconductor layer, and a conductive second electrode are laminated, electromotive force is generated by photoexciting the electron in the band gap of the electromotive force layer by light irradiation, the electromotive force layer is filled with an n-type metal oxide semiconductor of fine particles coated by an insulating coat, a new energy level is formed in a band gap by photoexcited structural change caused by ultraviolet irradiation, and efficient and stable operation can be performed by providing a layer of an n-type metal oxide semiconductor between the first electrode and the electromotive force layer.

21 Claims, 10 Drawing Sheets

(51) Int. Cl.
*H02N 6/00* (2006.01)
*H01L 31/0384* (2006.01)
*H01L 31/0352* (2006.01)
*H01L 31/0236* (2006.01)
*H01G 9/20* (2006.01)
*H01L 31/0392* (2006.01)
*H01M 14/00* (2006.01)
*H01L 31/0296* (2006.01)
*H01L 31/072* (2012.01)
*H01L 31/18* (2006.01)
*H01L 31/0224* (2006.01)

(52) U.S. Cl.
CPC ......... *H01G 9/2031* (2013.01); *H01G 9/2036* (2013.01); *H01L 31/0296* (2013.01); *H01L 31/02366* (2013.01); *H01L 31/0352* (2013.01); *H01L 31/0392* (2013.01); *H01L 31/072* (2013.01); *H01L 31/1828* (2013.01); *H01M 14/005* (2013.01); *H01L 31/022425* (2013.01); *H01L 31/022466* (2013.01); *Y02E 10/50* (2013.01)

(58) Field of Classification Search
CPC ... H01L 31/0392; Y02E 10/50; H01G 9/2031; H01G 9/2036; H01G 9/2027; H01G 9/204
USPC ................ 136/252, 255, 256, 250, 263, 265
See application file for complete search history.

(56) References Cited

U.S. PATENT DOCUMENTS

| | | | |
|---|---|---|---|
| 2003/0140963 A1* | 7/2003 | Yamanaka et al. | ........... 136/263 |
| 2007/0137693 A1* | 6/2007 | Forrest | .......................... 136/255 |
| 2008/0223436 A1* | 9/2008 | den Boer | .......... H01L 31/02246 136/256 |
| 2009/0293947 A1 | 12/2009 | Higuchi et al. | |
| 2013/0224596 A1* | 8/2013 | Nakazawa | ..................... 429/220 |
| 2014/0352775 A1* | 12/2014 | Kudoh et al. | ................. 136/256 |

FOREIGN PATENT DOCUMENTS

| | | | |
|---|---|---|---|
| JP | 3-29374 | | 2/1991 |
| JP | 2000-174304 | | 6/2000 |
| JP | 2001167808 | A * | 6/2001 |
| JP | 2003-298032 | | 10/2003 |
| JP | 2005-64493 | | 3/2005 |
| JP | 2007-266488 | | 10/2007 |
| JP | 2007-335792 | | 12/2007 |
| JP | 2009-117431 | | 5/2009 |
| JP | 2009-182290 | | 8/2009 |
| WO | 2009/002876 | A1 | 12/2008 |

OTHER PUBLICATIONS

Palomares et al. "Control of charge recombination dynamics in dye sensitized solar cells by the use of conformally deposited metal oxide blocking layers". J. Am. Chem. Soc. 2003. 125, 475-482.*

Extended European Search Report mailed May 16, 2014 in corresponding European Application No. 10858134.9.

Guodan Wei et al., "Intermediate-Band Solar Cells Employing Quantum Dots Embedded in an Energy Fence Barrier", Nano Letters, *American Chemical Society*, US, vol. 7, No. 1, Dec. 2, 2006, pp. 218-222.

International Search Report of Corresponding PCT Application PCT/JP2010/067644 mailed Dec. 14, 2010.

U.S. Appl. No. 13/856,029, filed Apr. 3, 2013, Nakazawa, Akira.

U.S. Appl. No. 14/355,509, filed Aug. 4, 2014, Kudoh, Takuo et al.

* cited by examiner

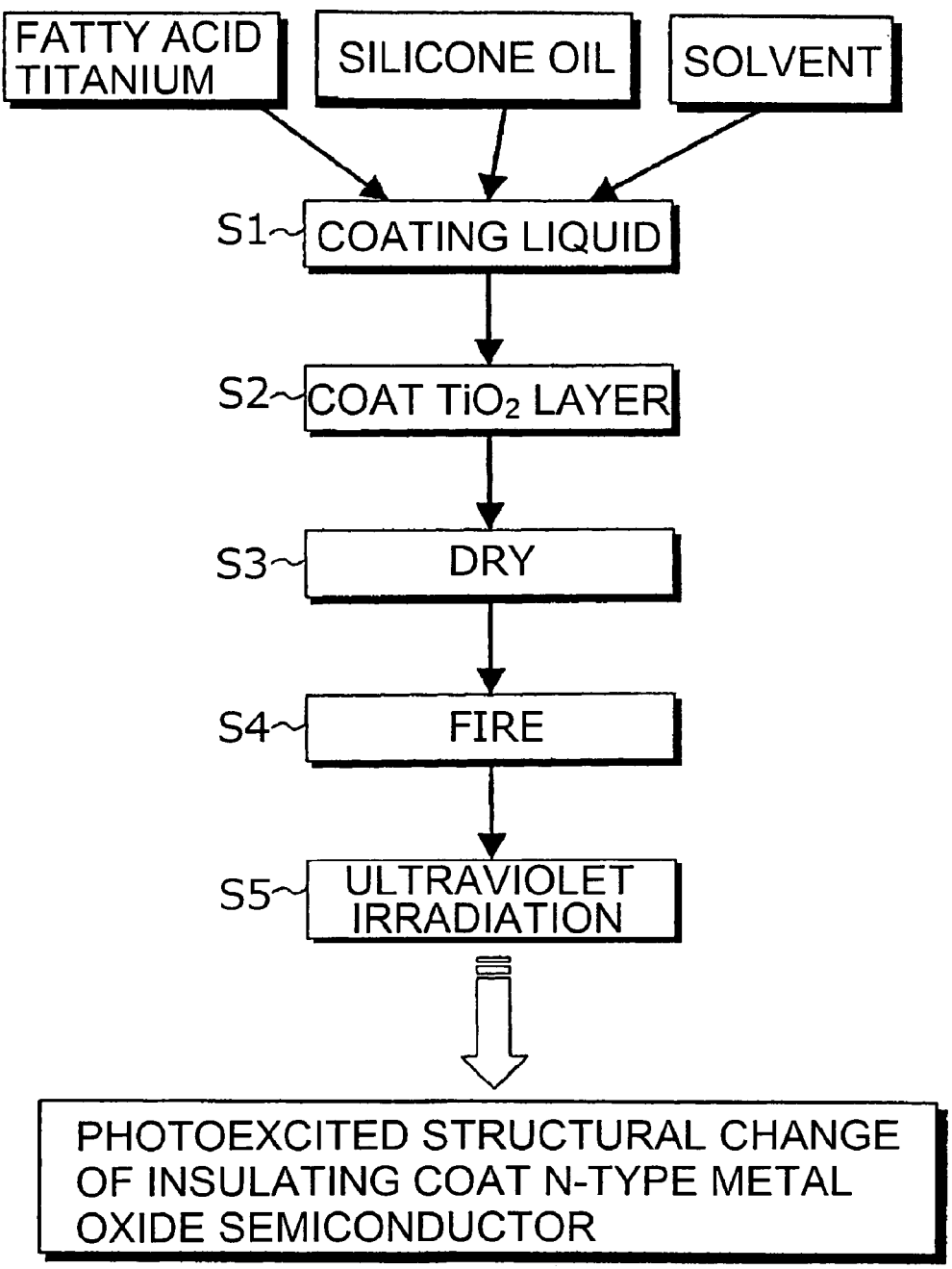

US 9,711,668 B2

PHOTOVOLTAIC CELL

CROSS REFERENCE TO RELATED APPLICATION

This application is a continuation of International application No. PCT/JP2010/067644, filed on Oct. 7, 2010, the contents of which are incorporated herein by reference.

BACKGROUND OF THE INVENTION

Field of the Invention

The present invention relates to a photovoltaic cell of an inorganic solid excellent in safety and environmental resistance, based on an operation principle utilizing photoexcited structural change of a metal oxide.

Description of the Related Art

Amid growing awareness of global environmental problems such as exhaustion of fossil fuels and warming associated with increases in carbon dioxide, attention is being given to photovoltaic cells as clean energy sources. While materials for photovoltaic cells fall into three categories which are a silicon system, a compound system, and an organic system, the silicon system is most widely used in terms of resource abundance and cost.

In principle, light is applied to the junction between a p-type semiconductor and an n-type semiconductor, so that electrons are generated by photovoltaic effect, moved unidirectionally by rectification, and extracted out of an electrode, thereby converting light energy into electrical energy.

FIG. 12 is a band diagram for explaining the principle of a silicon photovoltaic cell. There are shown in FIG. 12 a conduction band 58, a valence band 60, and a Fermi level 62 when an n-type semiconductor 76 and a p-type semiconductor 78 form a junction. In the vicinity of the junction, electrons 64 and holes 65 diffuse and become bound together, generating diffusion current, so that the electrons 64 and the holes 65 cancel each other, and a depletion layer 80 of few electrons and holes is formed in the vicinity of the junction. At this time, a positive potential is formed in an n-type semiconductor region, and a negative potential is formed in a p-type semiconductor region.

In this state, upon irradiation with light, i.e., sunlight 36 having energy above a band gap, electron-hole pairs are formed in silicon. The electrons 64 and the holes 65 diffuse in silicon and reach the pn junction. By the electric field of the pn junction, the electrons 64 and the holes 65 are separated and move to the n-type semiconductor region and the p-type semiconductor region, respectively. In this process, excessive electrons gather in the n-type semiconductor region which becomes negatively charged, and the p-type semiconductor region becomes positively charged, so that current flows through the load from the electrode of the p-type semiconductor region to the electrode of the n-type semiconductor region.

A big technical problem of the photovoltaic cell is to improve conversion efficiency. Accordingly, various proposals have conventionally been made.

Structure surfaces of the photovoltaic cell include a BSF (Back Surface Field) type (e.g., see Japanese Patent Application Laid-Open Publication No. 2009-182290 (Patent Document 1) and Japanese Patent Application Laid-Open Publication No. 2007-266488 (Patent Document 2)) for reducing carrier recombination loss by providing an electric field on a back surface and a BSR (Back Surface Reflection) type (e.g., see Japanese Patent Application Laid-Open Publication No. 2000-174304 (Patent Document 3)) for reducing operating temperature by reflecting light of energy below a band gap which reaches a back surface without generating carriers and becomes heat.

Further, a photovoltaic cell having light-absorbing layers made of a chalcopyrite structure semiconductor and having a double graded band gap that in the light-absorbing layers a first semiconductor layer decreases a band gap as the band gap approaches a second semiconductor layer and the second semiconductor layer has a band gap larger than a minimum band gap in the first semiconductor layer is proposed as a photovoltaic cell having a band structure ideal for enhancement of energy conversion efficiency (e.g., see Japanese Patent Laid-Open Publication No. 2007-335792 (Patent Document 4)).

Further, a photovoltaic cell structure in which a light-absorbing layer has a localized level or an intermediate band in a band gap by forming a heterojunction pn junction formed by laminating an n-type semiconductor having a larger band gap than the light-absorbing layer on the light incident side of the p-type light-absorbing layer is also proposed (e.g., see Japanese Patent Application Laid-Open Publication No. 2009-117431 (Patent Document 5).

The improvement of conversion efficiency has conventionally been an important problem of the photovoltaic cell of any type including the silicon type.

Hindrances to the conversion efficiency include transmission loss, quantum loss, electron-hole pair recombination loss, loss caused by an imperfect pn junction, and reflection loss of a photovoltaic cell surface. The transmission loss is caused by the transmission of photons having energy below the band gap. The quantum loss occurs when electron-hole pairs generated by photons having energy above the band gap retain energy corresponding to only the band gap and the rest changes to thermal energy. The electron-hole pair recombination loss is recombination loss at the silicon surface and inside. The loss caused by the imperfect pn junction is also a production problem. The reflection loss of the photovoltaic cell surface is caused by the reflection of part of the sunlight from a transparent electrode surface.

As proposed as means for increasing efficiency in Patent Document 5, the photovoltaic cell structure having the localized level or the intermediate band in the band gap of the light-absorbing layer is a structure for reducing loss as a method for effectively decreasing the band gap. However, the structure is formed by cleaning and/or etching the surface of a p-type ZnTe substrate by an organic solvent, forming a p-type ZnTe1-xOx light-absorbing layer by reacting zinc in a vapor state, tellurium (Te) in a vapor state, and radical oxygen on the surface of the p-type ZnTe substrate by molecular beam epitaxy (MBE), and then laminating an n-type ZnO layer on the p-type ZnTe1-xOx light-absorbing layer by reacting zinc in a vapor state and radical oxygen by molecular beam epitaxy (MBE), which is complicated in terms of structure and production.

SUMMARY OF THE INVENTION

It is an object of the present invention to provide a photovoltaic cell for enabling cost reduction and stable operation with a simple configuration and enhancing conversion efficiency by a new technology of forming an energy level in a band gap.

According to an aspect of the present invention, to achieve a photovoltaic cell that enhances conversion efficiency with simple configuration and production method, a substrate, a conductive first electrode, an electromotive force layer for forming an energy level in a band gap by photoexcited structural change of an n-type metal oxide semiconductor coated by an insulating substance and capturing an electron, a p-type semiconductor layer, and a conductive second electrode are laminated. Electromotive force is generated by photoexciting the electron in the band gap of the electromotive force layer by light irradiation.

By providing a layer of an n-type metal oxide semiconductor between the first electrode and the electromotive force layer, conversion efficiency can be enhanced and stable operation can be performed.

If the substrate is made of a conductive material and doubles as the first electrode, a structure can be simplified.

At least one of the first electrode and the second electrode is a transparent electrode, and electromotive force is generated by applying light through the transparent electrode. Further, the photovoltaic cell according to the invention is colored by electron movement to the electromotive force layer by applying light, which improves optical absorptance.

As for materials, the n-type metal oxide semiconductor provided between the first electrode and the electromotive force layer is titanium dioxide, and the p-type semiconductor is nickel oxide or a copper aluminum oxide. The n-type metal oxide semiconductor in the electromotive force layer is one of tin oxide, titanium dioxide, and zinc oxide or a composite thereof, and the insulating substance coating the n-type metal oxide semiconductor is insulating resin or an inorganic insulator.

As for a production method, the electromotive force layer is produced by a production process including a step of dissolving an organic metal salt obtained by binding organic matter to an element of the n-type metal oxide semiconductor and an insulator in an organic solvent and applying it on the first electrode provided on the substrate or on the layer of the n-type metal oxide semiconductor provided on the first electrode, a step of drying and firing after application, and a step of irradiating a layer of the n-type metal oxide semiconductor coated by the insulating substance with ultraviolet light for photoexcited structural change after the firing.

The substrate can be formed of a resin sheet, thereby enabling a flexible photovoltaic cell.

An asperity shape on a surface of the first electrode can increase the surface area to absorb light energy more efficiently, and improve the adhesion of the surface to the electromotive force layer to reduce loss caused by a structural defect.

The photovoltaic cell according to the invention also has a charging function in the electromotive force layer; therefore, at the time of no light irradiation, energy from the electromotive force layer can maintain a function of a cell.

BRIEF DESCRIPTION OF THE DRAWINGS

FIG. 3 is a diagram for explaining a production process of the electromotive force layer subjected to photoexcited structural change;

DETAILED DESCRIPTION OF THE PREFERRED EMBODIMENTS

The present invention is directed to a photovoltaic cell based on a new electromotive force principle of adopting a photoexcited structural change technology in an electromotive force layer. The photoexcited structural change refers to the phenomenon of changing the interatomic distance of a substance excited by light irradiation, and a new energy level is formed in a band gap of the n-type metal oxide semiconductor by utilizing the property of causing the photoexcited structural change by an n-type metal oxide semiconductor as an amorphous metal oxide.

Figure 1:
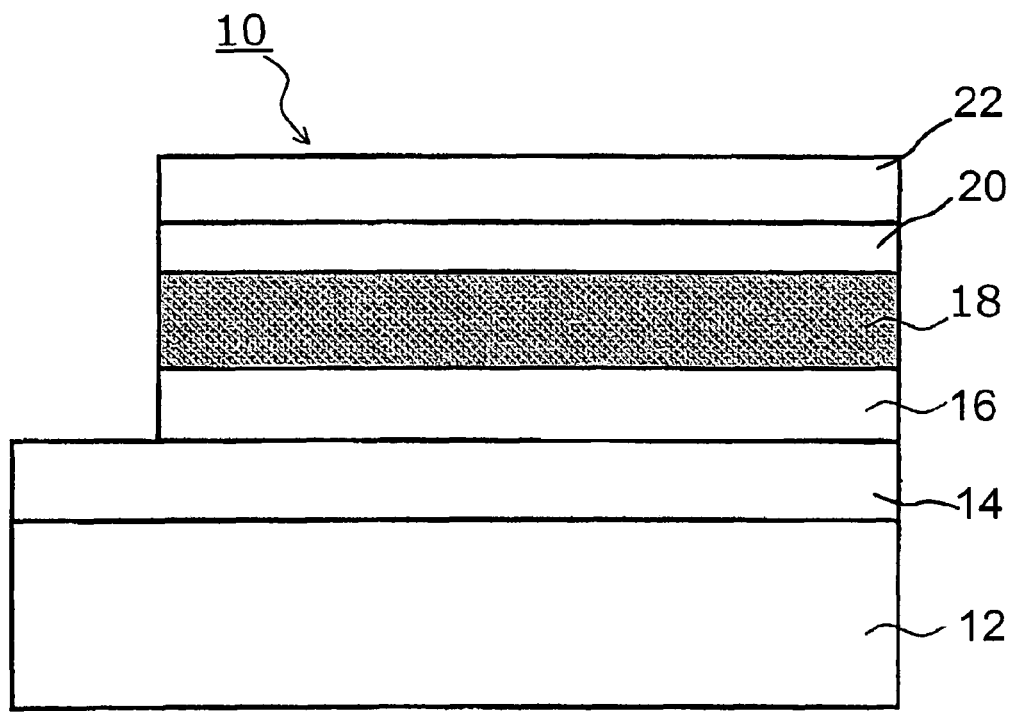
FIG. 1 is a diagram showing the configuration of a photovoltaic cell according to the present invention.

FIG. 1 is a diagram showing the cross section structure of a photovoltaic cell according to the invention. In FIG. 1, in a photovoltaic cell 10, a conductive first electrode 14 is formed on a substrate 12. Further, an n-type metal oxide semiconductor layer 16, an electromotive force layer 18 for generating electromotive force by light irradiation, a p-type metal oxide semiconductor layer 20, and a second electrode 22 are laminated.

The substrate 12 may be an insulating substance or a conducting substance. For example, a glass substrate, a resin sheet of a polymer film, or a metal foil sheet can be used.

The first electrode 14 and the second electrode 22 can be formed of a conductive film. For example, a silver (Ag) alloy film including aluminum (Al) can be used as a metal electrode. Its formation method includes vapor deposition such as sputtering, ion plating, electron beam deposition, vacuum deposition, and chemical vapor deposition. The metal electrode can be formed by electroplating, electroless plating, or the like. In general, copper, copper alloy, nickel, aluminum, silver, gold, zinc, tin, or the like can be used as metal used for plating.

Further, a conductive film of tin-doped indium oxide (Indium Tin Oxide (ITO)) can be used as a transparent conductive electrode.

Titanium dioxide ($TiO_2$), tin oxide ($SnO_2$), or zinc oxide (ZnO) is used as a material for the n-type metal oxide semiconductor layer 16.

The electromotive force layer 18 is filled with an n-type metal oxide semiconductor of fine particles coated by an insulating coat and is a layer having an electromotive force function by photoexcited structural change caused by ultraviolet irradiation. The n-type metal oxide semiconductor is coated by a silicone insulating coat. Titanium dioxide, tin oxide, and zinc oxide are suitable for the n-type metal oxide semiconductor material that can be used in the electromotive force layer 18. A combination of any two or all three of titanium dioxide, tin oxide, and zinc oxide may be used as a composite material.

The p-type metal oxide semiconductor layer 20 formed on the electromotive force layer 18 is provided to prevent electron injection from the upper second electrode 22. Nickel oxide (NiO), a copper aluminum oxide (CuAlO$_2$), or the like can be used as a material for the p-type metal oxide semiconductor layer 20.

Next, an example of actual trial production will be described.

Glass was used as the substrate 12. A conductive film of tin-doped indium oxide (Indium Tin Oxide (ITO)) as the electrode 14 was formed on the glass substrate 12, and titanium dioxide as the n-type metal oxide semiconductor layer was formed on the ITO, by sputtering. The p-type metal semiconductor layer 20 was formed of nickel oxide by sputtering, and the second electrode 22 was formed of ITO, like the first electrode 14.

The structure and production method of the electromotive force layer 18 will be described in detail below.

Figure 2:
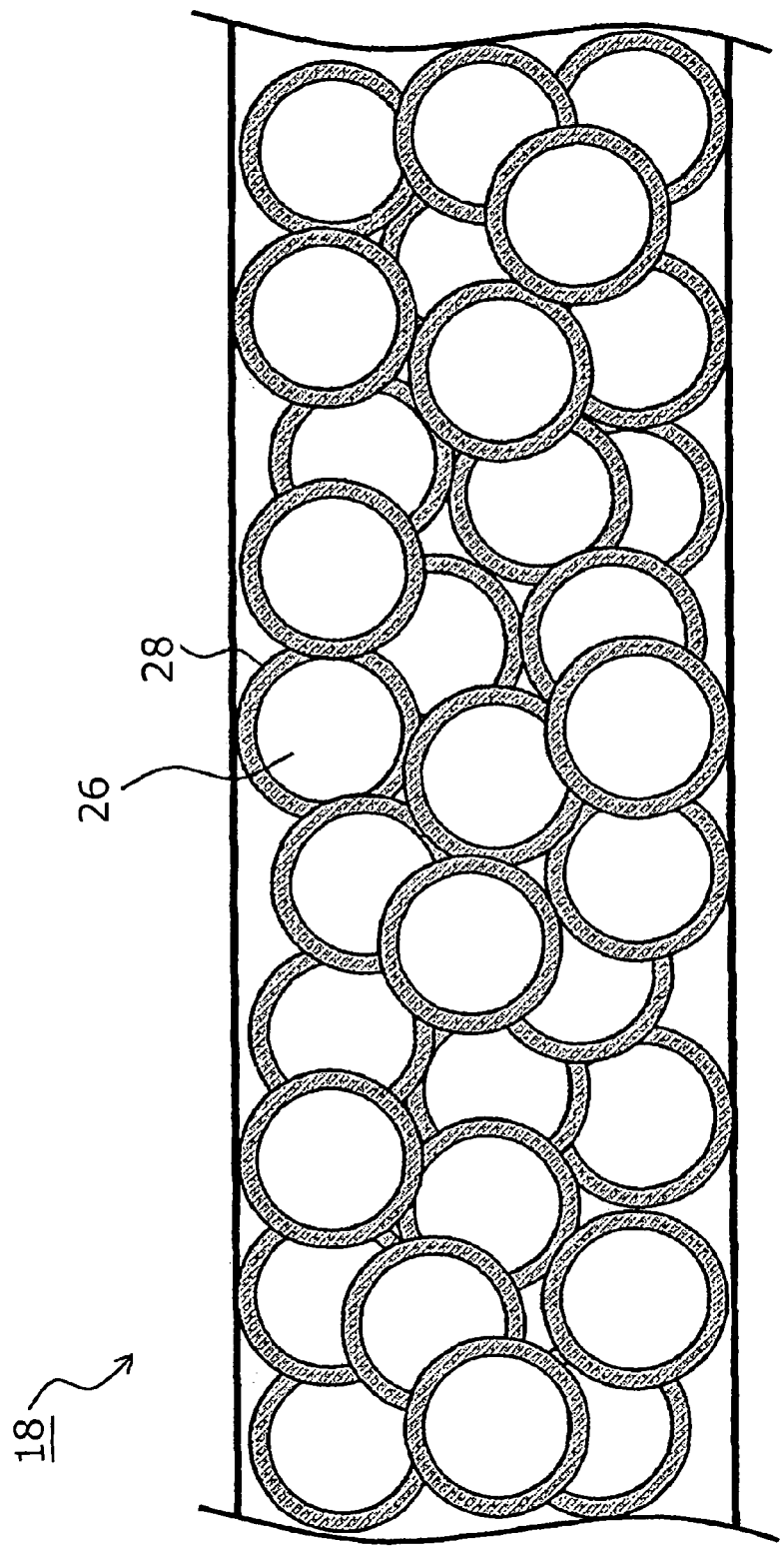
FIG. 2 is a diagram for explaining an electromotive force layer of the photovoltaic cell according to the invention.

FIG. 2 is a diagram for explaining in detail the structure of the electromotive force layer 18 in FIG. 1. In the electromotive force layer 18, silicone is used as an insulating coat 28, and titanium dioxide is used as an n-type metal oxide semiconductor 26, so that the electromotive force layer 18 is filled with titanium dioxide coated by silicone. The electromotive force layer 18 has the function of storing energy by photoexcited structural change caused by irradiating titanium dioxide with ultraviolet light.

A material for the n-type metal oxide semiconductor 26 used in the electromotive force layer 18 is titanium dioxide, tin oxide, or zinc oxide, and is produced by decomposing a metal aliphatic acid salt in a production process. Accordingly, a material that can decompose or burn by ultraviolet irradiation or firing under an oxidizing atmosphere into a metal oxide is used as the metal aliphatic acid salt. Aliphatic polycarboxylic acid such as aliphatic monocarboxylic acid, aliphatic dicarboxylic acid, aliphatic tricarboxylic acid, or aliphatic tetracarboxylic acid can be used as aliphatic acid.

More specifically, saturated aliphatic monocarboxylic acid includes formic acid, acetic acid, propionic acid, caproic acid, enanthic acid, caprylic acid, pelargonic acid, capric acid, and stearic acid. Polyunsaturated monocarboxylic acid such as acrylic acid, butenoic acid, crotonic acid, isocrotonic acid, linolenic acid, and oleic acid can be used as unsaturated aliphatic monocarboxylic acid.

Further, it is preferable that the aliphatic acid salt be the salt of aliphatic acid and metal due to ease of decomposition or burning by heating, high solvent solubility, denseness of a film after decomposition or burning, ease of handling, low cost, ease of synthesis of salt of metal, and the like.

The insulating coat 28 may be, besides silicone, mineral oil, magnesium oxide (MgO), silicon dioxide (SiO$_2$), or the like as an inorganic insulator, or the insulating coat 28 may be, as insulating resin, thermoplastic resin such as polyethylene, polypropylene, polystyrene, polybutadiene, polyvinyl chloride, polymethyl methacrylate, polyamide, polycarbonate, polyimide, or cellulose acetate, or thermosetting resin such as phenolic resin, amino resin, unsaturated polyester resin, allyl resin, alkyd resin, epoxy resin, or polyurethane.

FIG. 3 is a diagram for explaining the process of the production method of the electromotive force layer 18.

First, a substrate in which layers of ITO and titanium dioxide are formed on the glass substrate 12 by sputtering is prepared. Then, by mixing and stirring fatty acid titanium and silicone oil in a solvent, coating liquid is made (S1). Then, a spinner spin-coats the layer of titanium dioxide with the coating liquid while rotating the prepared substrate (S2). A thin layer of 0.3 to 1 μm is formed by rotating the substrate. Specifically, this layer can be considered to have a structure in which the metal salt of titanium dioxide coated by silicone is embedded in a silicone layer without a void part.

Then, it is dried for about 10 minutes at an ambient temperature of 50° C. (S3), and then fired (S4). The firing temperature is 300 to 400° C., and the firing time is 10 minutes to 1 hour. This decomposes the aliphatic acid salt and forms a fine particle layer of titanium dioxide coated by a silicone insulating coat.

The above-described production method of forming the layer of titanium dioxide coated by the silicone insulating coat is called a coating thermal decomposition method.

The next production step is an ultraviolet irradiation step (S5). Ultraviolet irradiation is performed for about 40 minutes at a wavelength of 254 nm and an intensity of 20 mW/cm$^2$. The ultraviolet irradiation changes the interatomic distance of titanium dioxide in the electromotive force layer to cause a photoexcited structural change phenomenon. As a result, a new energy level is formed in a band gap of titanium dioxide.

Figure 4A:
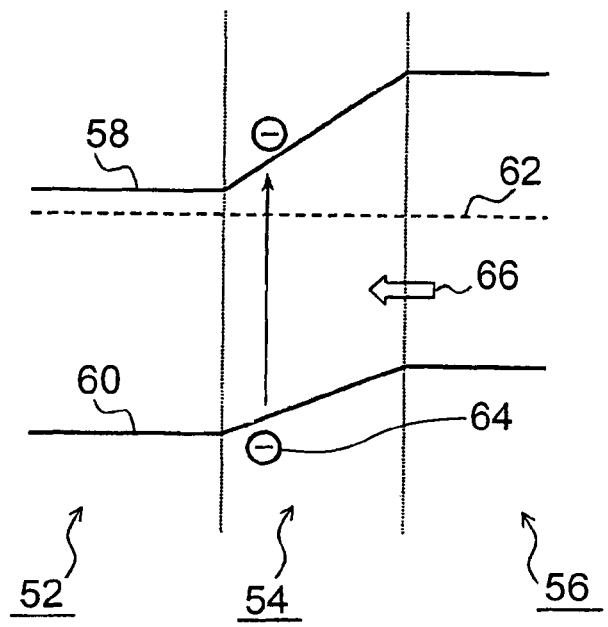
FIGS. 4A and 4B are band diagrams for explaining a function of photoexcited structural change.
Figure 4B:
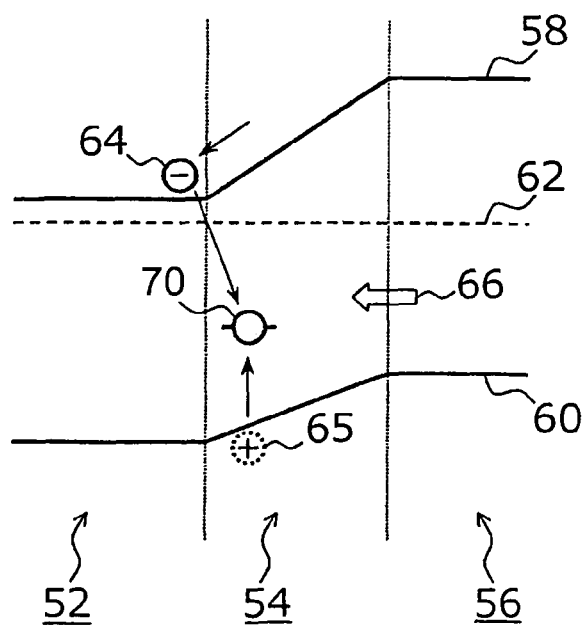

FIGS. 4A and 4B are band diagrams for explaining the phenomenon of forming a new energy level by photoexcited structural change of an ultraviolet-irradiated substance. First, to explain a basic principle, consideration will be given to a case in which a layer composed of tin oxide and magnesium oxide (SnO$_2$—MgO composite layer) is laminated on ITO.

FIG. 4A is a band diagram showing a structure composed of ITO 52, an intermediate crystalline layer 54, and an SnO$_2$—MgO composite layer 56. A Fermi level 62 exists between a conduction band 58 and a valence band 60. The Fermi level 62 of the ITO 52 is close to the conduction band 58, and the Fermi level 62 of the SnO$_2$—MgO composite layer 56 is intermediate between the conduction band 58 and the valence band 60. Upon irradiation with ultraviolet light 66, an electron 64 in the valence band 60 of the intermediate crystalline layer 54 is excited to the conduction band 58.

In a state of irradiation with the ultraviolet light 66 shown in FIG. 4B, the electron 64 in the valence band 60 in the region of the intermediate crystalline layer 54 is excited to the conduction band 58 by irradiation with the ultraviolet light 66, and the excited electron 64 is accommodated in the conduction band 58 of the ITO due to the gradient of the conduction band 58. On the other hand, a hole 65 remains in the valence band 60 because the electron 64 has been extracted therefrom. In the intermediate crystalline layer 54, a time difference occurs between ultraviolet irradiation and recombination, and this time difference causes atomic rearrangement. Accordingly, the hole 65 remaining in the valence band 60 of the intermediate crystalline layer 54 moves into a band gap, thus forming a new energy level 70. Further, the movement of the hole 65 into the band gap causes a coloring level and also causes a coloring phenomenon in an area, adjacent to the ITO 52, of the SnO$_2$—MgO composite layer 56.

Figure 5:
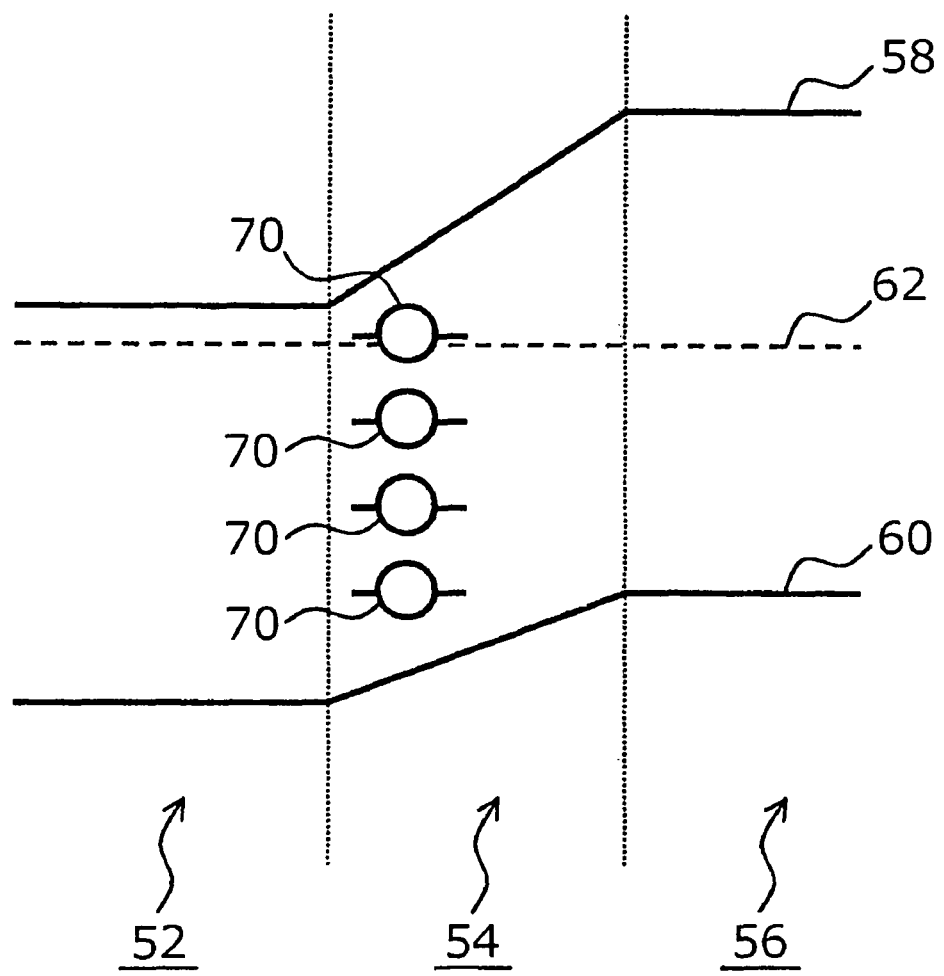
FIG. 5 is a band diagram for explaining new energy levels formed by photoexcited structural change.

FIG. 5 shows a state after recombination in which new energy levels 70 are formed in the band gap of the intermediate crystalline layer 54 by ultraviolet irradiation. An increase of electron density in the band gap is observed only at the interface between the ITO 52 and the SnO$_2$—MgO composite layer 56, and a chemical shift of core electrons is also observed; therefore, it can be considered that the interatomic spacing has changed.

As described above, by irradiating the SnO$_2$—MgO composite layer 56 with ultraviolet light, the new energy level 70 can be formed in the band gap. The photovoltaic cell utilizes the newly formed energy level 70, and it is necessary to form an insulating layer between the electrode and the n-type metal oxide semiconductor and control the electron.

The electromotive force layer 18 shown in FIG. 1 is the n-type metal oxide semiconductor made of titanium dioxide coated by the insulating coat 28 of silicone, as illustrated in FIGS. 1 and 2. In this case, a band diagram has a barrier by an insulating layer between titanium dioxide and ITO.

Figure 6A:
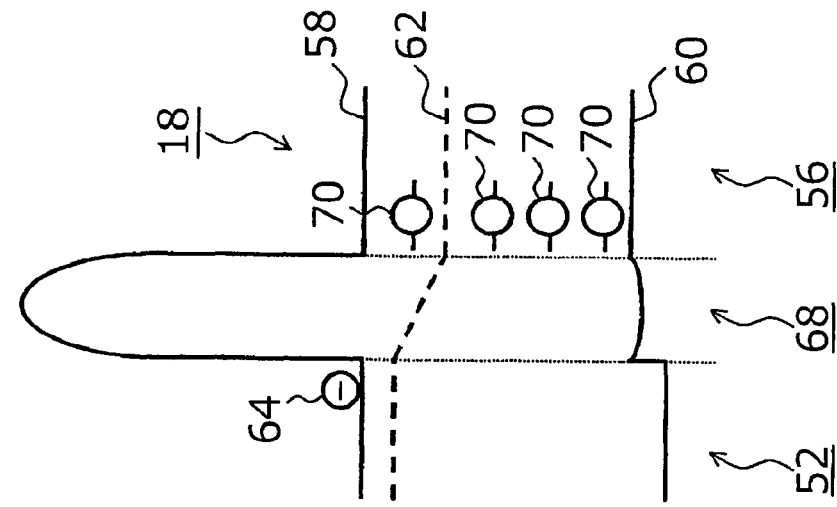
FIGS. 6A and 6B are band diagrams for explaining a function of photoexcited structural change of titanium dioxide coated by an insulating coat.
Figure 6B:
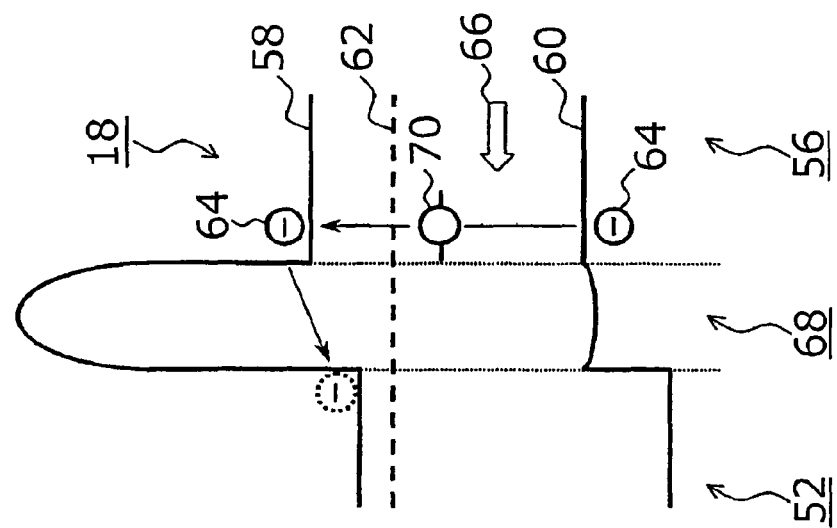

FIGS. 6A and 6B are band diagrams for explaining the state of forming a new energy level by photoexcited structural change in the presence of an insulating layer 68 between the ITO 52 and titanium dioxide 57. A barrier by the insulating layer 68 exists in the conduction band 58.

FIG. 6A is a band diagram of irradiation with the ultraviolet light 66 in the presence of the insulating layer 68 between the titanium dioxide 57 and the ITO 52. When the titanium dioxide 57 coated by the insulating coat is irradiated with the ultraviolet light 66, the electron 64 in the valence band 60 of the titanium dioxide 57 is excited to the conduction band 58. In the vicinity of an interface with the ITO 52, the electron 64 passes through the insulating layer 68 with a certain probability and temporarily moves to the ITO 52. The photoexcited structural change of the titanium dioxide 57 occurs in the absence of the electron, resulting in a change in the interatomic distance at a site of the valence band 60 from which the electron 64 has been extracted. At this time, the energy level 70 moves into a band gap.

In FIG. 6B, during irradiation with the ultraviolet light 66, the above phenomenon is repeated, and a number of energy levels 70 are formed in the band gap. However, electrons that should be captured at these energy levels 70 are excited by the ultraviolet light 66 and move to the ITO 52. The resulting electron-less energy levels 70 in the band gap remain even after the end of ultraviolet irradiation. The role of the insulating layer 68 is to form a barrier between the ITO 52 and the titanium dioxide 57 and pass excited electrons 64 to form the electron-less energy levels 70 in the band gap. The electrons 64 that have moved to the ITO 52 stay due to charge potential around the insulating layer 68.

Figure 7:
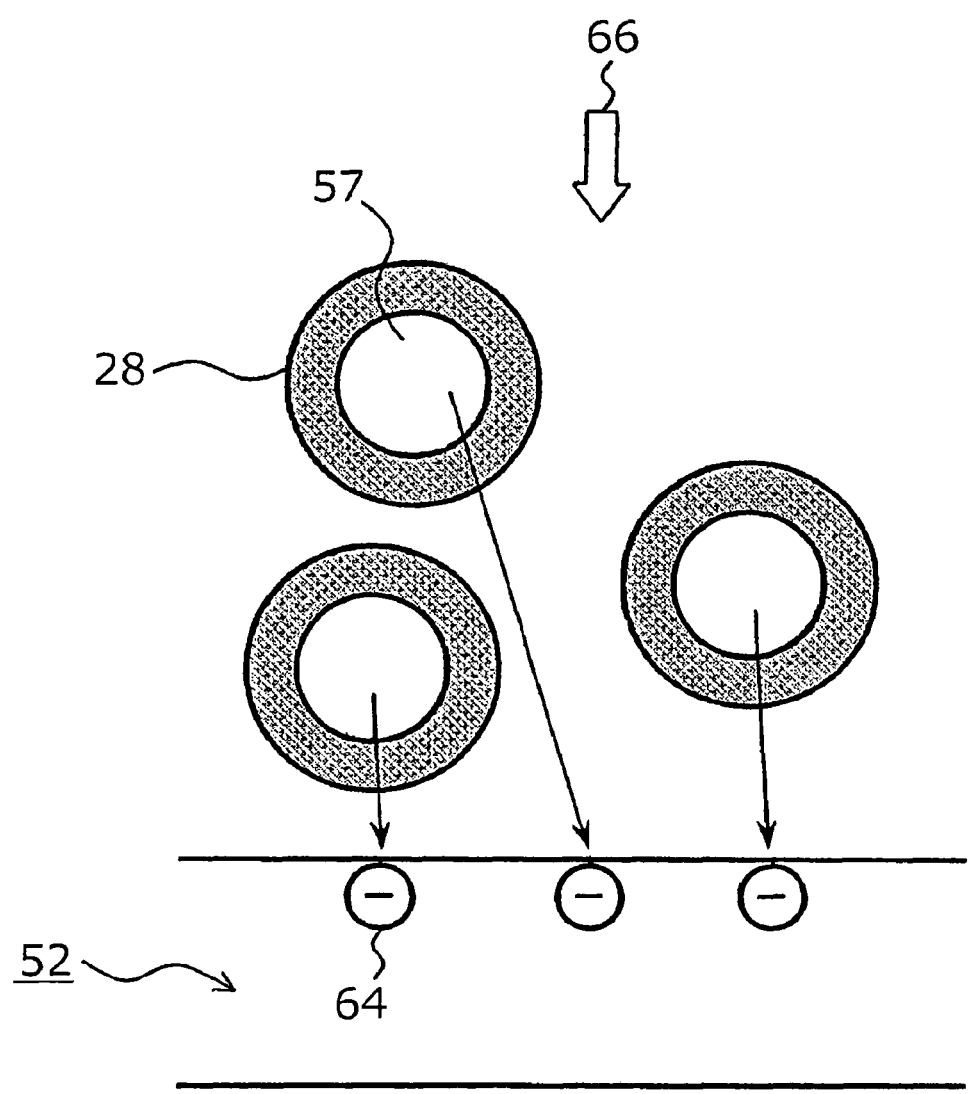
FIG. 7 is a diagram for explaining the movement of electrons by photoexcited structural change.

FIG. 7 is a diagram schematically showing a state in which electrons move to the ITO 52 by photoexcited structural change of the titanium dioxide 57 coated by the insulating coat 28 by ultraviolet irradiation. The electrons 64 pass through a barrier formed by the insulating coat 28 by tunneling and move to the ITO 52, and remain by weak capturing force caused by the potential of the insulating coat 28.

In the photovoltaic cell, a blocking layer is formed by laminating the p-type metal oxide semiconductor layer 20 on the electromotive force layer 18, and the second electrode 22 is provided. The principle of the photovoltaic cell with such a structure will be described with reference to band diagrams of FIGS. 8A and 8B.

Figure 8A:
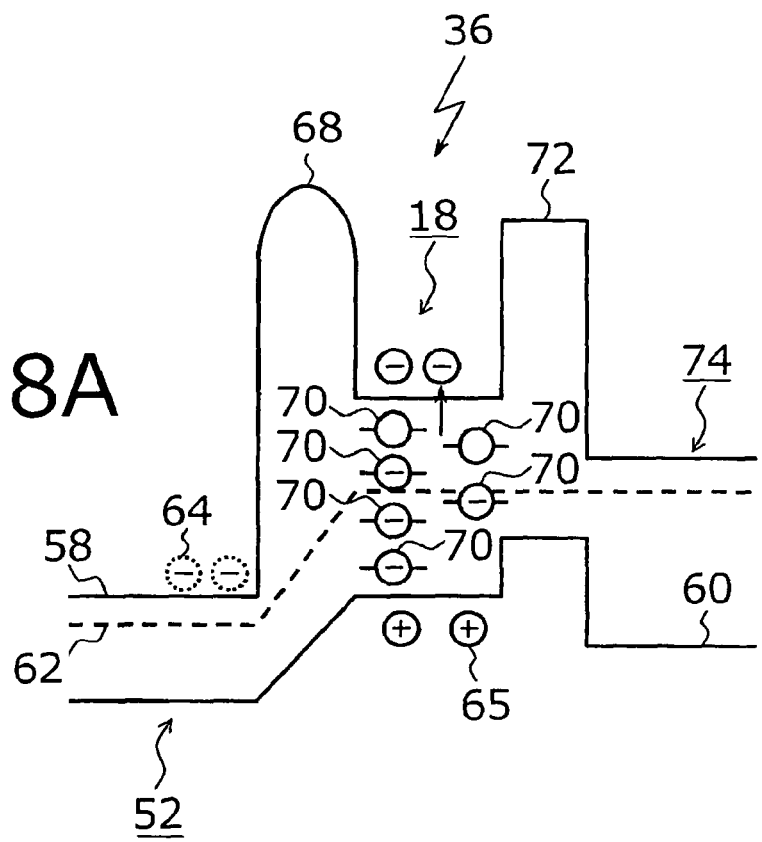
FIGS. 8A and 8B are band diagrams for explaining the function of the photovoltaic cell according to the invention.

FIG. 8A is a band diagram of the photovoltaic cell, irradiated with sunlight 36, which is composed of the insulating layer 68 and the titanium dioxide 57 in the electromotive force layer 18 and nickel oxide 72 functioning as the p-type metal oxide semiconductor 20 sandwiched between the ITO 52 forming the first electrode 14 and ITO 74 forming the second electrode 22.

The conduction band 58 has the barriers of the insulating layer 68 and the blocking layer 72 of the p-type metal oxide semiconductor 20 with the electromotive force layer 18 between them.

In general, photovoltaic cells basically have a structure in which a p-type semiconductor and an n-type semiconductor are sandwiched between electrodes. At this pn junction, a photovoltaic effect occurs, causing the potential of a direction that blocks electrons in an n-type region from moving to a p-type region and holes in the p-type region from moving to the n-type region. In this state, upon irradiation with light having energy above the band gap, electron-hole pairs (carriers) are formed. Electrons and holes reach the pn junction by diffusion. By the electric field of the pn junction, electrons and holes separate and move to the n-type region and the p-type region, respectively.

On the other hand, in the photovoltaic cell according to the invention shown in FIG. 8A, the p-type metal oxide semiconductor and the n-type metal oxide semiconductor form the pn junction, and the n-type metal oxide semiconductor is coated by the insulating coat, thereby forming the barrier. The titanium dioxide used as the n-type metal oxide semiconductor forms energy levels in the band gap by photoexcited structural change caused by ultraviolet irradiation. Accordingly, electrons are injected into energy levels by irradiation with light of energy below the band gap. By this process, the electromotive force layer 18 is filled with the electrons 64. This generates a potential difference, that is, electromotive force between the electrodes, which enables the function of the photovoltaic cell.

Figure 8B:
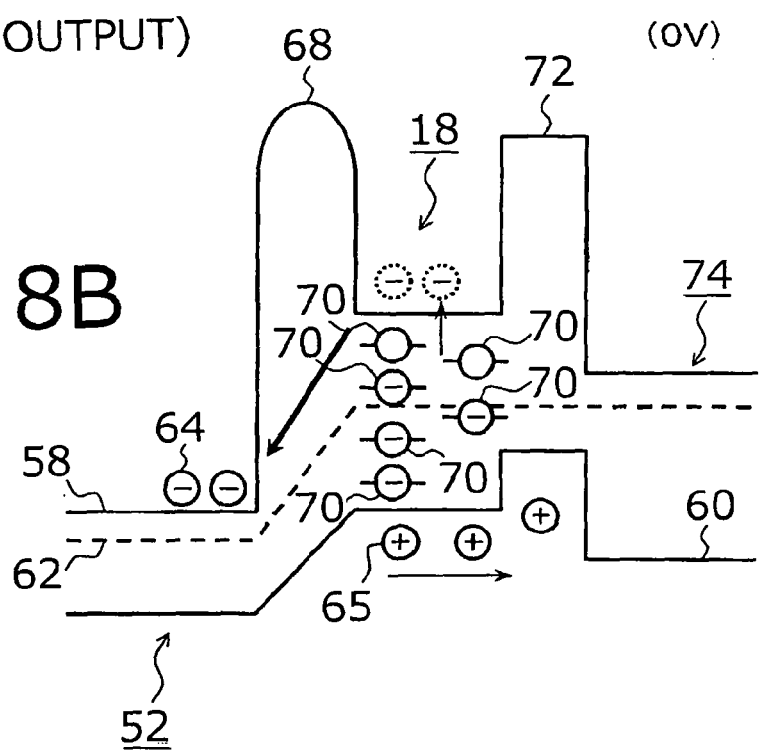

FIG. 8B is a band diagram in use as a power source, that is, in electron discharge to a load (not shown) connected between the ITO 52 and the ITO 74. By connecting the load, the potential difference between the electrodes causes electron release, that is, current flow. The electrons 64 pass through the insulating layer by the tunnel effect from the electromotive force layer 18 to be supplied, and electrons are successively supplied from the energy levels 70 in the band gap with low energy below the band gap energy because the sunlight 36 is applied. Even in a state where the load is connected, the energy levels 70 in the band gap are constantly filled with electrons.

More specifically, when the load is connected in the state of applying the sunlight 36, the electrons 64 that have been captured in the band gap turn into free electrons in the conduction band with a certain probability. These free electrons move to the ITO 52. Electron-hole pairs are formed in the electromotive force layer 18. The electrons 64 diffuse in the band gap and reach the energy levels 70, and the holes 65 move to the nickel oxide 72 region in the valence band 60 separately. In this process, excessive electrons gather in the ITO 52 which becomes negatively charged, and the nickel oxide 72 region becomes positively charged, so that the electrons 64 flow through the load to the ITO 74 used as the second electrode 22 from the ITO 52 to the nickel oxide 72.

As described above with reference to the band diagrams, by sunlight irradiation, the energy levels formed in the band gap of the titanium dioxide are filled with electrons; by connecting the load between the electrodes, electrons are released for energy extraction, thus functioning as the cell. This does not require light energy above the energy gap like conventional photovoltaic cells, and the electrons are excited to and fill the energy levels formed in the band gap, which enables the cell function with extremely low light energy.

Further, the photovoltaic cell also has a coloring function in a state where the electrons are embedded in the energy levels formed in the band gap of the titanium dioxide, and it is possible to extract all the embedded electrons. Therefore, even without sunlight irradiation, the photovoltaic cell can temporarily function as a secondary cell charged with energy.

Figure 9:
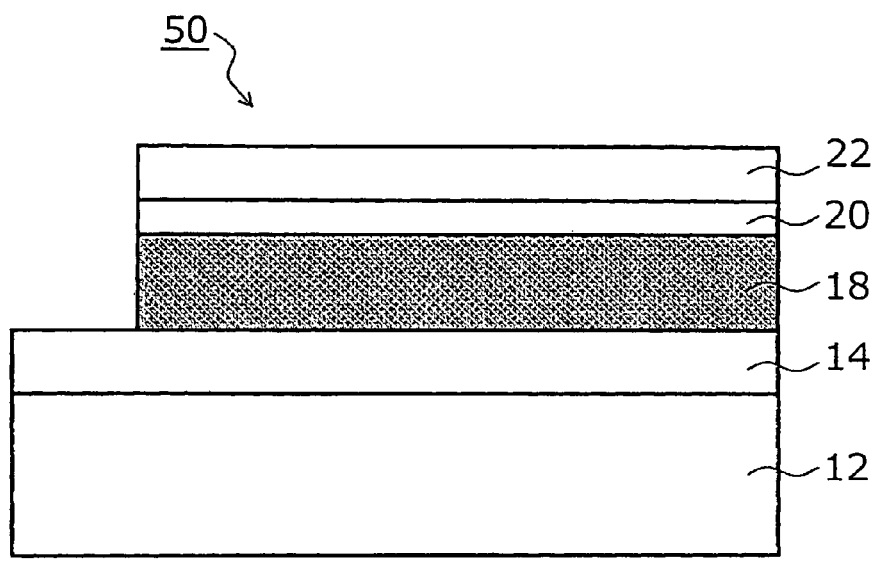
FIG. 9 is a diagram showing the basic configuration of the photovoltaic cell according to the invention.

FIG. 9 shows the configuration of a basic photovoltaic cell 50 according to the invention. In FIG. 9, the photovoltaic cell 50 has a configuration in which the conductive first electrode 14 is formed on the substrate 12, and the electromotive force layer 18 for generating energy, the p-type metal oxide semiconductor layer 20, and the second electrode 22 are laminated.

More specifically, ITO is laminated as the first electrode 14 on the glass substrate 12. Further, the electromotive force layer 18 formed of titanium dioxide that is coated by the insulating coat and has undergone photoexcited structural change, the p-type metal oxide semiconductor layer 20 of nickel oxide, and the second electrode of ITO are laminated.

Figure 10:
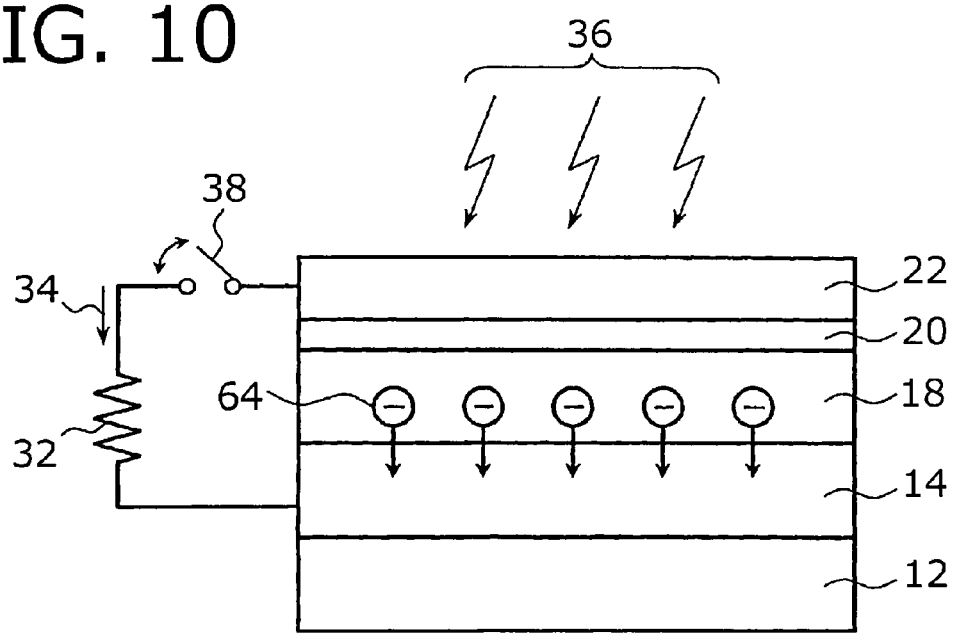
FIG. 10 is a diagram for explaining the usage state of the photovoltaic cell according to the invention.

FIG. 10 is a diagram for explaining the operation of the basic photovoltaic cell shown in FIG. 9 according to the invention.

When a load 32 is connected between the first electrode 14 and the second electrode 22 with the electromotive force layer 18 filled with the electrons 64, the electrons 64 move to the load side through the first electrode, and current 34 flows through the load 32. The connection of the load 32 to the photovoltaic cell 50 is controlled by turning on and off a switch 38. Even when the current flows through the load 32, the electrons 64 in the electromotive force layer 18 are constantly supplied by applying the sunlight 36.

Since the electromotive force layer 18 is filled with the electrons 64, the electromotive force layer 18 is colored by a coloring phenomenon in the titanium dioxide that has undergone photoexcited structural change, which improves optical absorptance.

Further, the formation of the new energy levels in the band gap prevents a phenomenon of photoexcitation energy seen in conventional photovoltaic cells, in which energy below the energy gap is lost and electron-hole pairs retain energy corresponding to only the energy gap and the rest changes to thermal energy; therefore, the photovoltaic cell according to the invention has a characteristic that reduces transmission loss and quantum loss.

Further, since the n-type metal oxide semiconductor is coated by the insulating layer, the photovoltaic cell also has a characteristic that reduces recombination loss.

Figure 11:
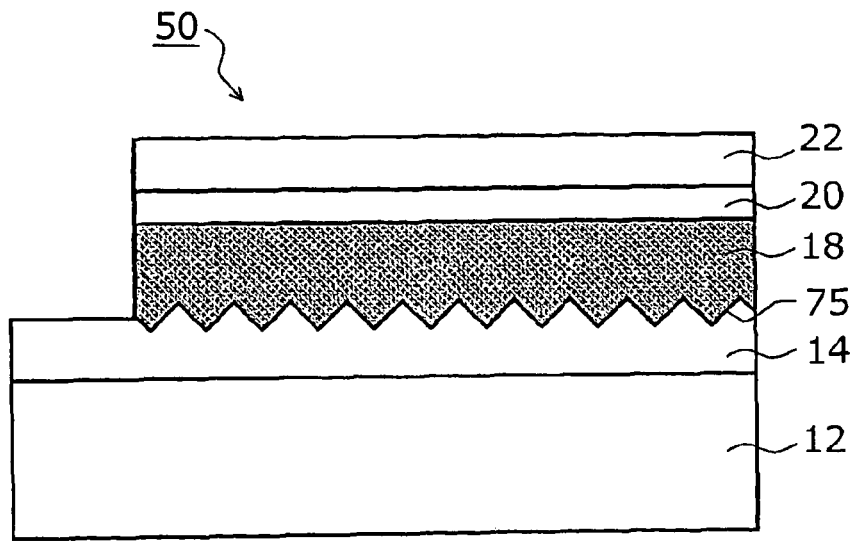
FIG. 11 is a diagram of the photovoltaic cell having a first electrode of a TEXTURE type where pyramid-shaped asperities are formed.
Figure 12:
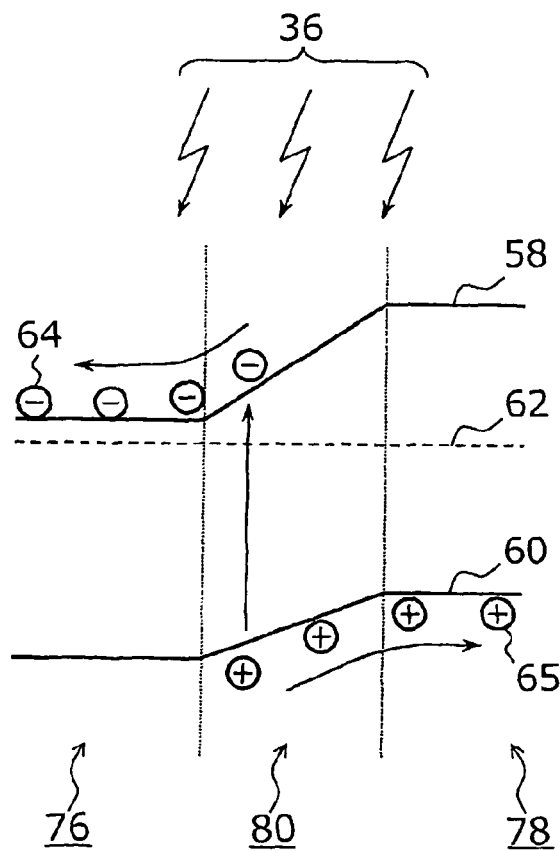
FIG. 12 is a band diagram for explaining the basic principle of the photovoltaic cell.

FIG. 11 shows a structure in which fine pyramids are formed on a surface of the first electrode of a TEXTURE type. The pyramid-shaped asperities improve the adhesion of a TEXTURE-type structure surface 75 of the first electrode 14 surface to the electromotive force layer 18. In irradiation with sunlight, it is possible to efficiently absorb incident light and reduce the loss of light energy, thus reducing the loss of light energy and improving the conversion efficiency.

The improvement in the adhesion of the first electrode 14 with the TEXTURE-type structure to the electromotive force layer 18 also advantageously reduces loss caused by an imperfect junction.

According to the photovoltaic cell of the invention, in the electromotive force layer, the titanium dioxide is coated by the insulating coat, and the conduction band has the barrier. This barrier function can be reinforced by forming a thin layer of titanium dioxide by sputtering between the first electrode and the electromotive force layer, which is the structure of the photovoltaic cell shown in FIG. 1.

While the titanium dioxide of the electromotive force layer is coated by the silicone insulating coat, a uniform coating is not always formed, which leads to variation. In an extreme case, a coating is not formed, so that the titanium dioxide might directly contact the electrode. In such a case, electrons are injected into titanium oxide by recombination, so that energy levels are not formed in the band gap, which causes a reduction in the conversion efficiency. Therefore, to increase the conversion efficiency of the photovoltaic cell, the thin layer of titanium dioxide is formed between the first electrode and the electromotive force layer, as shown in FIG. 1.

The thin layer of titanium dioxide functions as the insulating layer, with little variation in device characteristics, which effectively improves stability and yield on a production line.

The photovoltaic cell according to the invention, based on a power generation principle utilizing energy levels formed in the band gap instead of electron movement above the band gap, reduces losses such as transmission loss, quantum loss, electron-hole pair recombination loss, loss caused by an imperfect pn junction, and sunlight reflection loss, and has high conversion efficiency.

While the embodiment of the invention has been described, the invention includes appropriate modifications without impairing its objects and advantages, and is also not restricted by the above embodiment.

The effects of the present invention are as follows.

The photovoltaic cell according to the invention is based on an electromotive force principle utilizing a new energy level in a band gap formed by a technology utilizing photoexcited structural change of a metal oxide; accordingly, the photovoltaic cell can reduce transmission loss, quantum loss, and electron-hole pair recombination loss, improve the absorption of sunlight by a coloring function, and reduce the reflection loss of the photovoltaic cell surface.

The photovoltaic cell has the charging function, and therefore can also be used as a rechargeable photovoltaic cell.

The invention claimed is:

1. A photovoltaic cell comprising:
a substrate;
a conductive first electrode;
an electromotive force layer having
particles of a first n-type metal oxide semiconductor having energy levels in a band gap of the first n-type metal oxide semiconductor able to capture electrons at the energy levels, and having undergone photoexcited structural change by ultraviolet irradiation to obtain the energy levels, and
an insulating substance coated on the particles of the first n-type metal oxide semiconductor;
a p-type semiconductor layer; and
a conductive second electrode,
the substrate, the first electrode, the electromotive force layer, the p-type semiconductor layer, and the second electrode being laminated,
the photovoltaic cell being configured to generate electromotive force upon photoexcitation by light irradiation of electrons in the energy levels in the band gap of the first n-type metal oxide semiconductor, and
at least one of the first electrode and the second electrode being a transparent electrode, and the photovoltaic cell configured to have light applied through the transparent electrode.

2. The photovoltaic cell according to claim 1, wherein a layer of a second n-type metal oxide semiconductor is provided between the first electrode and the electromotive force layer.

3. The photovoltaic cell according to claim 1, wherein the substrate is made of a conductive material.

4. The photovoltaic cell according to claim 1, wherein the first n-type metal oxide semiconductor provided is titanium dioxide.

5. The photovoltaic cell according to claim 1, wherein the p-type semiconductor is nickel oxide or a copper aluminum oxide.

6. The photovoltaic cell according to claim 1, wherein the first n-type metal oxide semiconductor in the electromotive force layer is one of tin oxide, titanium dioxide, and zinc oxide or a composite thereof.

7. The photovoltaic cell according to claim 1, wherein the insulating substance coating the first n-type metal oxide semiconductor is insulating resin or an inorganic insulator.

8. The photovoltaic cell according to claim 1, wherein the electromotive force layer is produced by a production process including:
dissolving an organic metal salt obtained by binding organic matter to an element of the first n-type metal oxide semiconductor and an insulator in an organic solvent and applying it on the first electrode provided on the substrate or on a layer of a second n-type metal oxide semiconductor in a case where the layer of the second n-type metal oxide semiconductor is provided on the first electrode,
drying and firing after the applying, and
performing ultraviolet irradiation to obtain the photoexcited structural change after firing a layer of the metal salt of the first n-type metal oxide semiconductor coated by the insulating substance.

9. The photovoltaic cell according to claim 1, wherein the substrate is a resin sheet.

10. The photovoltaic cell according to claim 1, wherein a surface of the first electrode is textured.

11. The photovoltaic cell according to claim 1, wherein at the time of no light irradiation, energy from the electromotive force layer maintains a function of the cell.

12. The photovoltaic cell according to claim 2, wherein the substrate is made of a conductive material.

13. The photovoltaic cell according to claim 2, wherein the second n-type metal oxide semiconductor provided between the first electrode and the electromotive force layer is titanium dioxide.

14. The photovoltaic cell according to claim 2, wherein the p-type semiconductor is nickel oxide or a copper aluminum oxide.

15. The photovoltaic cell according to claim 2, wherein the first n-type metal oxide semiconductor in the electromotive force layer is one of tin oxide, titanium dioxide, and zinc oxide or a composite thereof.

16. The photovoltaic cell according to claim 2, wherein the insulating substance coating the first n-type metal oxide semiconductor is insulating resin or an inorganic insulator.

17. The photovoltaic cell according to claim 2, wherein the electromotive force layer is produced by a production process including:
dissolving an organic metal salt obtained by binding organic matter to an element of the first n-type metal oxide semiconductor and an insulator in an organic solvent and applying it on the first electrode provided on the substrate or on the layer of the second n-type metal oxide semiconductor in a case where the layer of the second n-type metal oxide semiconductor is provided on the first electrode,
drying and firing after the applying, and
performing ultraviolet irradiation to obtain the photoexcited structural change after firing a layer of the metal salt of the first n-type metal oxide semiconductor coated by the insulating substance.

18. The photovoltaic cell according to claim 2, wherein the substrate is a resin sheet.

19. The photovoltaic cell according to claim 2, wherein a surface of the first electrode is textured.

20. The photovoltaic cell according to claim 2, wherein at the time of no light irradiation, energy from the electromotive force layer maintains a function of the cell.

21. A photovoltaic cell comprising:
a substrate;
a conductive first electrode;
an electromotive force layer having:
electron-depleted particles of a first n-type metal oxide semiconductor, the particles having holes at energy levels within a band gap of the first n-type metal oxide semiconductor that are able to capture electrons at those energy levels, and having been treated with ultraviolet radiation sufficient to remove electrons from the particles and structurally alter the particles; and
an insulating substance coated on the particles of the first n-type metal oxide semiconductor;
a p-type semiconductor layer; and
a conductive second electrode,
the substrate, the first electrode, the electromotive force layer, the p-type semiconductor layer, and the second electrode being laminated,
the photovoltaic cell being configured to generate electromotive force upon photoexcitation by light irradiation of electrons in the energy levels in the band gap of the first n-type metal oxide semiconductor, and
at least one of the first electrode and the second electrode being a transparent electrode, and the photovoltaic cell configured to have light applied through the transparent electrode.

* * * * *